United States Patent [19]

Matouschek

[11] Patent Number: 5,049,704

[45] Date of Patent: Sep. 17, 1991

[54] ELECTRICAL CONDUCTOR ELEMENT

[76] Inventor: Thomas Matouschek, Kehlstrasse 14, 7316 Köngen, Fed. Rep. of Germany

[21] Appl. No.: 507,433

[22] Filed: Apr. 11, 1990

[30] Foreign Application Priority Data

May 9, 1989 [DE] Fed. Rep. of Germany ....... 3915068
Nov. 7, 1989 [DE] Fed. Rep. of Germany ....... 3937496

[51] Int. Cl.[5] ............................................ H05K 1/00

[52] U.S. Cl. .................................. 174/261; 174/254; 174/251; 174/259; 361/406; 340/506; 340/550; 109/42

[58] Field of Search ................. 174/117 A, 84 R, 259, 174/261, 254, 251; 219/529, 528; 361/406, 404; 340/550, 506; 109/41, 42

[56] References Cited

U.S. PATENT DOCUMENTS

| | | | |
|---|---|---|---|
| 1,142,393 | 6/1915 | Bloomer | 219/529 |
| 3,130,257 | 4/1964 | Rott | 174/254 |
| 3,946,143 | 3/1976 | McLoughlin | 174/84 R |
| 4,310,811 | 1/1982 | Currie | 174/254 |
| 4,799,435 | 1/1989 | Boutroy . | |

FOREIGN PATENT DOCUMENTS

| | | |
|---|---|---|
| 317490 | 3/1919 | Fed. Rep. of Germany . |
| 1923185 | 5/1969 | Fed. Rep. of Germany . |
| 1962102 | 12/1969 | Fed. Rep. of Germany . |
| 2148570 | 9/1971 | Fed. Rep. of Germany . |
| 2202930 | 1/1972 | Fed. Rep. of Germany . |
| 3332536 | 9/1983 | Fed. Rep. of Germany . |
| 978051 | 12/1964 | United Kingdom . |

*Primary Examiner*—Leo P. Picard
*Assistant Examiner*—Trinidad Korka
*Attorney, Agent, or Firm*—Browdy and Neimark

[57] ABSTRACT

An electrical conductor element in the form of a flexible or rigid sheet is provided for detecting attempts to break into a space where valuables or money are being stored, such as a strongroom or the coin container of a slot machine. The base material of the element is in the form of a woven or non-woven material or of plastic sheeting, and the electrical conductor is in the form of wire such as enameled copper wire for electrical connection with an alarm system. The conductor is secured in place by stitching, that is to say the wire is either formed into penetrating stitches by being fed from the needle or shuttle of a sewing machine or it is fed from a stationary part of the sewing machine so as to be fixed in place by stitches or conventional textile yarn or thread. When the conductor is interrupted by drilling, sawing or the like the alarm system is activated.

12 Claims, 3 Drawing Sheets

ELECTRICAL CONDUCTOR ELEMENT

BACKGROUND OF THE INVENTION

The invention relates to an electrical conductor arrangement for security purposes on areas of safes, strongrooms, slot machines and other containers for money and valuables, in the form of a sheet material bearing wiring as electrical conductors, whose lengths are arranged alongside each other and adapted for connection with a security alarm system.

In order to prevent theft from safes, strongrooms, and slot machines by sawing, drilling, using brute force and other methods, it is an accepted practice to lay electrical conductors on the inner or outer surfaces of the walls of the enclosure where the money or valuables are held and to connect such conductor with an electronic alarm system which supplies an electrical current to the conductor to detect any interruption therein. In the event of violence being exerted on the conductor so that it is interrupted the alarm system is tripped.

Such an alarm system is described in the German patent publication DE-A 2,148,570, in which the electrical conductor is to be secured in place by bonding or pressing or it is to be produced on the base by printing.

This method is slow and expensive, the reliability of the attachment not being very high so that this type of attachment has hardly proved successful in practice.

SHORT SUMMARY OF THE INVENTION

One object of the present invention is to provide an electrical conductor arrangement for security alarms for use on areas of walls etc. which may be economically produced.

A further aim of the invention is to provide such a conductor arrangement which is of superior quality.

In order to achieve these or other objects appearing herein the electrical conductor is attached by stitching, that is say by forming the conductor into stitches linking it with a base or by using stitches of thread to sew it in place on such base.

The invention will now be described in more detail with reference to the drawings which show different embodiments thereof.

LIST OF THE SEVERAL VIEWS OF THE FIGURES

DETAILED ACCOUNT OF EMBODIMENTS OF THE INVENTION

Figure 1:
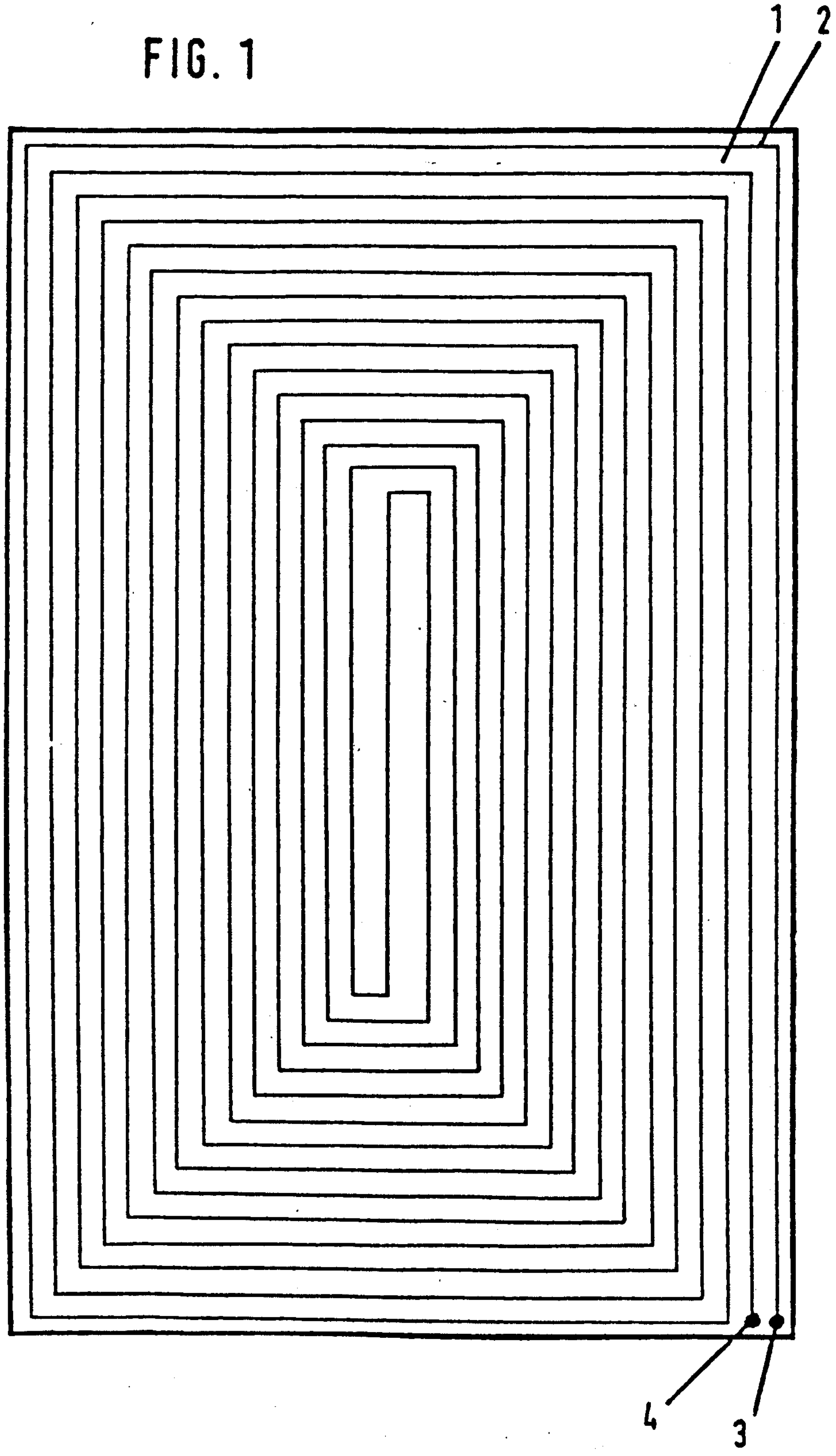
FIG. 1 shows a first embodiment with an electrical conductor arranged in a spiral with parallel turns or lengths arranged parallel to each other as a rectangularly deformed spiral.
Figure 2:
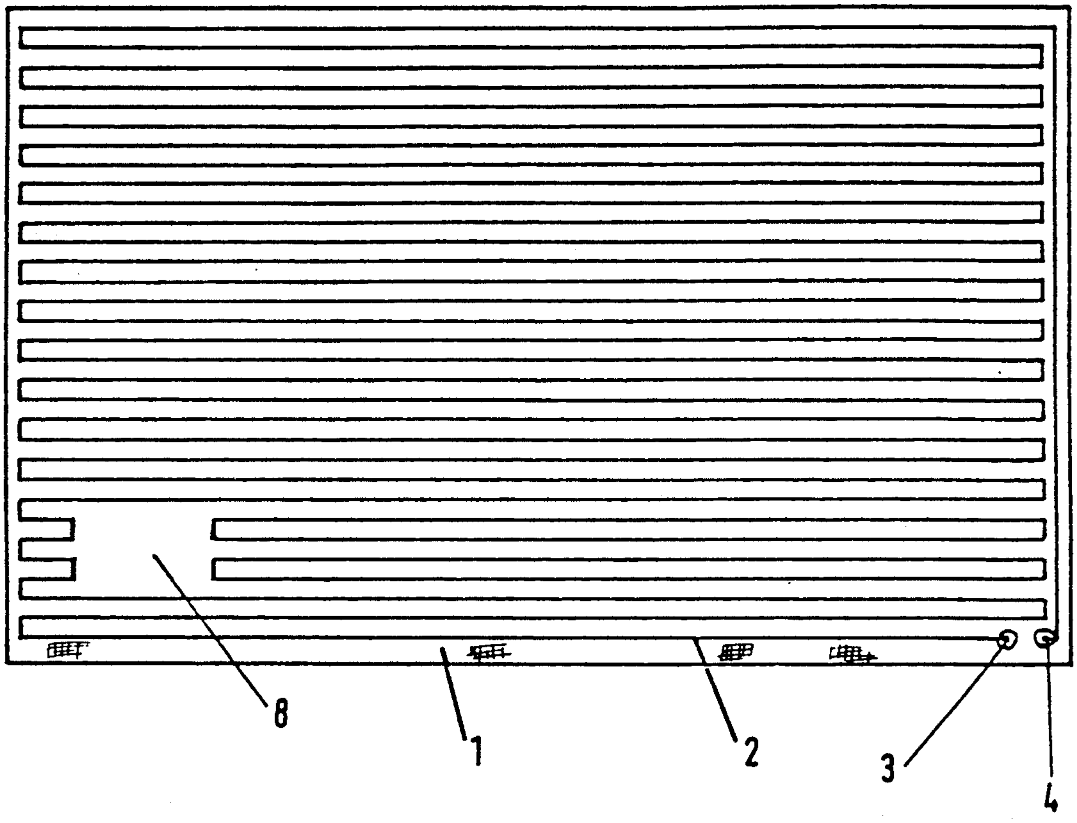
FIG. 2 shows a second embodiment of the invention in which the lengths of the electrical conductor are in a boustrophedon arrangement.
Figure 3:
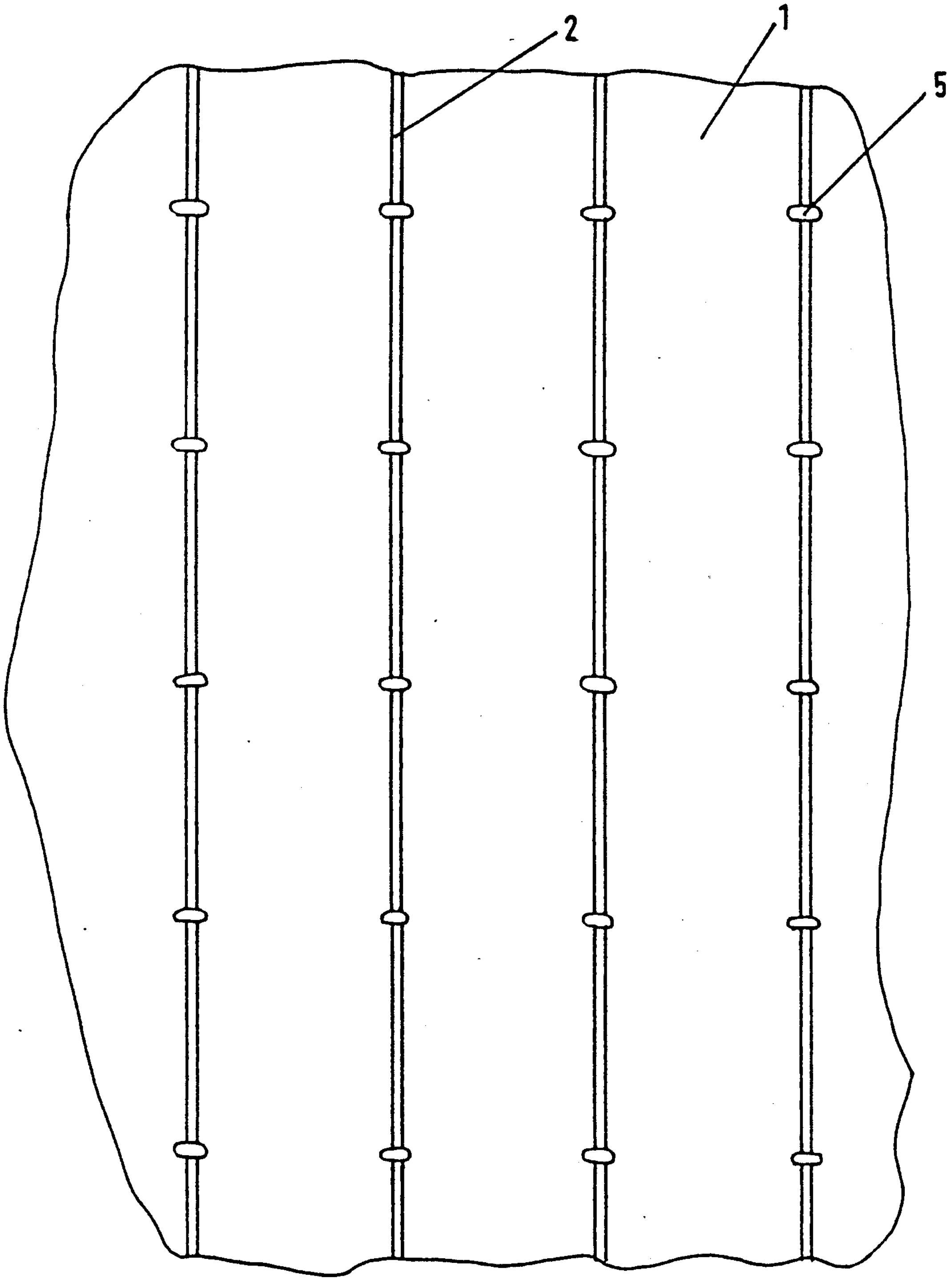
FIG. 3 is a view to show four lengths of the conductor on a larger scale.

In the case of the working embodiments of the invention depicted in FIGS. 1 and 2 the purpose is to provide a security system for areas, such as wall surfaces of a safe or the like, and this is ensured by the provision of a thin flexible sheet of electrically insulating base material 1, as for instance in the form of sheeting of bats, that is to say non-woven material, of a woven material, or of a film, on which an electrical conductor 2, such a enamelled copper wire is attached by sewing so that the conductor runs in parallel lengths or turns, such attachment by sewing being for instance by using the wire as one thread coming from a moving part of sewing machine (either as the upper thread from a stationary bobbin or from the shuttle) or for instance so that the loops produced in the upper or lower thread hold the wire and are so large that the wire or electrical conductor is applied in a straight form and is only bent when the end of a length is reached. Then the wire 2 comes from the sewing machine foot so that a thread 5 is trained around it and holds it in place by forming stitches over the wire 2, this being shown in FIG. 3. For attachment of the wire 2 it is possible to use zigzag stitches extending over the wire 2.

The sewing of the wire or electrical conductor to the base material may be controlled rapidly and automatically by a programmable sewing or stitching machines or embroidering machines, it being possible to achieve a very firm attachment of the wire in place and any desired form of gap may be produced as shown in FIG. 2 at 8.

The electrical conductor element consisting of the electrical conductor 2 and the base material 1 for a security alarm system for application to areas of walls etc. may be produced in large sizes owing to the use of automatic production machines at a low cost.

The electrical conductor 2 applied in this manner only has a beginning 3 and an end 4 and is between the beginning and the end is continuous.

Figure 4:
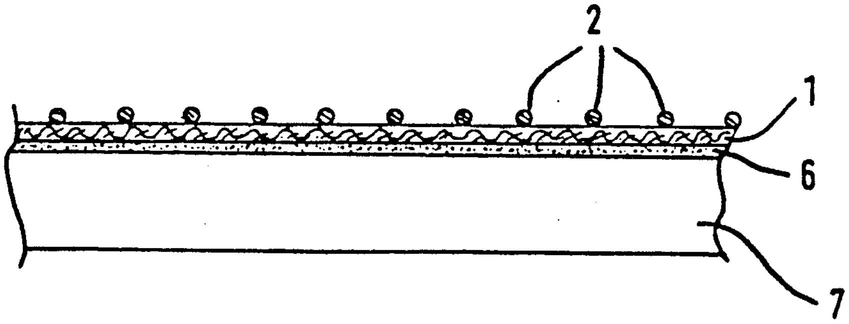
FIG. 4 is a sectional view of an electrical conductor element mounted on plasterboard as a base material.

In order to facilitate mounting of the electrical conductor element it is possible to apply double-side adhesive film 6 as indicated in FIG. 4 to the base. This makes possible simple adhesive attachment of the prepared electrical conductor elements to the wall of the valuables container such as a strongroom or a slot machine in which money is collected. The electrical conductor elements may be rendered impermeable to water by the application of liquid wax thereto and it may also be given a screeded finish with concrete or the like to stiffen it.

Another possibility of facilitating mounting of the element is a method in which for each side of the wall, floor or ceiling to be covered a separate electrical conductor element is produced which is mounted on a stiff carrier 7 such as a piece of plasterboard so that the board with the element attached thereto as a component of the security alarm system may be arranged in the strongroom or the like, this being indicated in FIG. 4.

When the security alarm system is turned on a current pulse is caused to flow through the continuous wire 2 from the beginning to the end thereof by the electronic circuit of the alarm system. If the wire 2 is interrupted owing to the activities of a thief using a saw or a drill or attempting forceable entry in some other way, a drop in the current through the wire 2 will be caused and this will be detected at the end 4 of the wire 2 so that an alarm will be raised by such electronic circuit, which may be designed in accordance with the initially mentioned prior art.

I claim:

1. An electrical conductor element for providing security against forceable entry into an enclosure, comprising sheeting in the form of a base and an electrical conductor arranged thereon for attachment with the circuit of a security alarm system, such wire being attached to such base by sewing, in a security alarm system connected to said electrical conductor for passing an electric current.

2. The electrical conductor element as claimed in claim 1 wherein such conductor is enameled copper wire.

3. The electrical conductor element as claimed in claim 1, wherein said conductor is attached to the base in the form of lengths which are sewn to the base by means of stitches of a thread separate from said conductor and penetrating such base.

4. The electrical conductor element as claimed in claim 1 wherein the said conductor itself is configured in the form of stitches penetrating such base.

5. The electrical conductor element as claimed in claim 1, wherein said conductor is made integrally from end to end.

6. The electrical conductor element as claimed in claim 1, wherein the base has gaps therein free of electrical conductor base.

7. The electrical conductor element as claimed in claim 1, comprising double sided adhesive film on one side of said base for attachment purposes.

8. The electrical conductor element as claimed in claim 1, wherein a rear side of the base remote from the conductor is provided with a material which has been applied in a heated to render it impermeable to water.

9. The electrical conductor element as claimed in claim 1, wherein such base is made of rigid material.

10. The electrical conductor element as claimed in claim 1, wherein said base is made of a woven material.

11. The electrical conductor element as claimed in claim 1, wherein said base is a flexible sheet of textile-like material.

12. An electrical conductor element for providing security against forceable entry into an enclosure, comprising sheeting in the form of a base and an electrical conductor arranged thereon for attachment with the circuit of a security alarm system, such wire being attached to such base by sewing, alarm means for establishing a current in said conductor and for detecting a drop in said current.

* * * * *